(12) United States Patent
Chang et al.

(10) Patent No.: US 10,039,181 B2
(45) Date of Patent: Jul. 31, 2018

(54) TOUCH-SENSING ELECTRODE STRUCTURE AND METHOD OF MANUFACTURING THE SAME

(71) Applicant: TPK Touch Systems (Xiamen) Inc., Xiamen (CN)

(72) Inventors: Chen-Hsin Chang, Taoyuan (TW); Bin Zhong, Xiamen (CN); Fuding Wang, Quanzhou (CN); Zhenjun Fei, Xiamen (CN); Lixian Chen, Xiamen (CN)

( * ) Notice: Subject to any disclaimer, the term of this patent is extended or adjusted under 35 U.S.C. 154(b) by 596 days.

(21) Appl. No.: 14/074,698

(22) Filed: Nov. 7, 2013

(65) Prior Publication Data

US 2014/0131069 A1     May 15, 2014

(30) Foreign Application Priority Data

Nov. 9, 2012   (CN) .......................... 2012 1 0472208

(51) Int. Cl.
*H05K 1/02*        (2006.01)
*H05K 3/40*        (2006.01)
*G06F 3/044*       (2006.01)

(52) U.S. Cl.
CPC ........... *H05K 1/0213* (2013.01); *G06F 3/044* (2013.01); *H05K 3/40* (2013.01); *G06F 2203/04111* (2013.01); *H05K 2201/0326* (2013.01); *H05K 2201/10128* (2013.01)

(58) Field of Classification Search
CPC .... G02F 1/13338; G06F 3/0412; G06F 3/044; G06F 3/045; G06F 3/0488; G06F 3/04883
See application file for complete search history.

(56) References Cited

U.S. PATENT DOCUMENTS

| | | | | |
|---|---|---|---|---|
| 2006/0284257 A1* | 12/2006 | Kwak | ................... | H01L 22/34 257/355 |
| 2008/0062139 A1* | 3/2008 | Hotelling | ............ | G02F 1/13338 345/173 |
| 2010/0045886 A1* | 2/2010 | Kwak | ............... | G02F 1/133351 349/40 |
| 2011/0199324 A1* | 8/2011 | Wang | ................... | G06F 3/0412 345/173 |
| 2011/0216018 A1* | 9/2011 | Kim | ....................... | G06F 3/041 345/173 |
| 2012/0044160 A1* | 2/2012 | Lan | ........................ | G06F 3/044 345/173 |
| 2012/0188199 A1* | 7/2012 | Sekiguchi | ............... | G06F 3/044 345/174 |

(Continued)

*Primary Examiner* — Kent W Chang
*Assistant Examiner* — Nathaniel P Brittingham

(57) ABSTRACT

The present disclosure provides a touch-sensing electrode structure, which includes a plurality of touch-sensing electrodes. Each of the touch-sensing electrodes includes a main body and a connecting portion connected to an end of the main body; wherein the width of the connecting portion is not less than a half width of the end of the main body. The touch-sensing electrode structure also includes a plurality of signal-transmitting wires, each of which includes a head portion and a tail wire connected to the head portion. The head portions of the signal-transmitting wires is superimposed on the connecting portions and electrically connected to the connecting portions respectively. Furthermore, a method of manufacturing the above touch-sensing electrode structure is also provided.

25 Claims, 8 Drawing Sheets

(56) References Cited

U.S. PATENT DOCUMENTS

| | | | | |
|---|---|---|---|---|
| 2012/0327021 A1* | 12/2012 | Ryu | ............... | G06F 3/044 |
| | | | | 345/174 |
| 2013/0155000 A1* | 6/2013 | Trend | ............... | G06F 3/044 |
| | | | | 345/174 |
| 2013/0162552 A1* | 6/2013 | Huang | ............... | G06F 3/044 |
| | | | | 345/173 |
| 2013/0199915 A1* | 8/2013 | Guard | ............... | G06F 3/044 |
| | | | | 200/600 |
| 2013/0229364 A1* | 9/2013 | Yu | ............... | G06F 3/044 |
| | | | | 345/173 |
| 2013/0234973 A1* | 9/2013 | Kim | ............... | G06F 3/044 |
| | | | | 345/173 |
| 2013/0241841 A1* | 9/2013 | Orsley | ............... | G06F 3/044 |
| | | | | 345/173 |
| 2013/0241857 A1* | 9/2013 | Chung | ............... | G06F 3/041 |
| | | | | 345/173 |
| 2013/0278511 A1* | 10/2013 | Kang | ............... | G06F 3/044 |
| | | | | 345/173 |
| 2013/0285938 A1* | 10/2013 | Kang | ............... | G06F 3/041 |
| | | | | 345/173 |
| 2013/0300678 A1* | 11/2013 | Kang | ............... | G06F 3/044 |
| | | | | 345/173 |
| 2013/0335365 A1* | 12/2013 | Kim | ............... | G06F 3/044 |
| | | | | 345/174 |
| 2014/0131069 A1* | 5/2014 | Chang | ............... | H05K 3/40 |
| | | | | 174/251 |
| 2014/0139481 A1* | 5/2014 | Han | ............... | G06F 3/044 |
| | | | | 345/174 |
| 2014/0327627 A1* | 11/2014 | Weng | ............... | G06F 3/044 |
| | | | | 345/173 |
| 2014/0368755 A1* | 12/2014 | Chen | ............... | G06F 3/044 |
| | | | | 349/12 |

\* cited by examiner

TOUCH-SENSING ELECTRODE STRUCTURE AND METHOD OF MANUFACTURING THE SAME

BACKGROUND OF THE INVENTION

This Application claims priority of the People's Republic of China Patent Application No. 201210472208.4, filed on Nov. 9, 2012, the entirety of which is incorporated by reference herein.

Field of the Invention

The present disclosure relates to a touch-sensing apparatus; and more particularly, to a touch-sensing electrode structure and a method of manufacturing the same.

Description of the Prior Art

With the advancement of technology, many electronic products have discontinued use of traditional input devices such as keyboards or mouses in favor of touch panels. Existing touch panels generally use the following methods for sensing touch: capacitive sensing, resistive sensing, surface acoustic wave technology, infrared sensing, etc. Capacitive sensing is the most commonly used method.

A capacitive touch panel usually includes a substrate, a sensing electrode disposed on the substrate, and metal signal-transmitting wires disposed at the peripheral region of the substrate. The sensing electrode near the peripheral region is formed by a main body and a connecting portion connected to an end of the main body. The width of the connecting portion is smaller than half the width of the end of the main body. The signal-transmitting wires are each formed by a head portion and a tail wire. The head portions of the signal-transmitting wires are superimposed on the corresponding connecting portions of the sensing electrodes. The head portions of the signal-transmitting wires and the connecting portions of the sensing electrodes have similar sizes. Capacitive touch panels are attached on electronic devices as touch-sensing apparatuses for users to operate with. Given that a gap exists between the touch panel and the electronic device, a user can easily transfer static electricity from his body into the gap during operation, accumulating electricity on the peripheral region of the touch panel. Additionally, a large amount of static electricity in the air also accumulates on the peripheral region of the touch panel. Therefore the effect of static electricity on the connecting portion of the electrode and the signal-transmitting wires at the peripheral region is increased.

According to Joule's Law: $Q=I^2Rt$, static electricity passing through signal-transmitting wires or sensing electrodes produces heat. Given that impedance of metal signal-transmitting wires is smaller (approximately several hundred Ohms), the heat generated by static electricity passing through the metal signal-transmitting wires is not sufficient to burn the wires. However, the higher impedance of the connecting portions of the sensing electrodes (approximately several thousand Ohms) results in generating more heat. Given that the width of the connecting portion is smaller than half the width of the end of the main body, if other parameters (such as length and height) are constant, the limited cross-sectional area of the connecting portion of the sensing electrode causes the static electricity distributed on an unit area to be high, such that the connecting portion of the sensing electrode is burned due to difficulty in dissipating the heat generated thereat. Consequently, circuits are shorted and the touch panel is busted. Therefore, this type of capacitive touch panel is vulnerable to static electricity.

SUMMARY OF THE INVENTION

The present disclosure is to provide a static-electricity resistant touch-sensing electrode structure which reduces the amount of heat generated by reducing the amount of static electricity per unit area on the connecting portion of the sensing electrode.

Therefore, the present disclosure provides a touch-sensing electrode structure, including: a sensing electrode having a main body and a connecting portion connected to an end of the main body, wherein the width of the connecting portion is larger than or equal to half the width of the end of the main body; and signal-transmitting wires each having a head portion and a tail wire connected to the head portion; wherein the head portions of the signal-transmitting wires are superimposingly disposed on and electrically connected to the connecting portion of the sensing electrodes. The connecting portions are rectangular or trapezoidal in shape.

More specifically, the width of the connecting portion is equal to half the width of the end of the main body. The connecting portion can be positioned at a central position at the end of the main body. Alternatively, the connecting portion can be positioned on one side of the end of the main body.

More specifically, the head portion of the signal-transmitting wire completely covers the connecting portion.

More specifically, the width of the connecting portion is equal to the width of the end of the main body. The head portion of the signal-transmitting wire partially covers the connecting portion. Alternatively, the head portion of the signal-transmitting wire is superimposingly disposed on the center of the connecting portion. Alternatively, the head portion of the signal-transmitting wire is superimposingly disposed on a side of the connecting portion. Alternatively, the head portion of the signal-transmitting wire completely covers the connecting portion.

More specifically, the connecting portion has a first edge contacted with the end of the main body and a second edge distant from the end of the main body. The distance between the first edge and the second edge is between 0.02 millimeter and 0.4 millimeter.

More specifically, the touch-sensing electrode structure further includes a substrate. The touch-sensing electrode structure is disposed on a substrate.

More specifically, the touch-sensing electrode structure further includes a mask layer. The mask layer is disposed in the peripheral region and sandwiched between the substrate and the touch-sensing electrode structure.

The present disclosure provides a method of manufacturing a touch-sensing electrode structure, including the following steps: forming a plurality of sensing electrodes, each having a main body and a connecting portion connected to an end of the main body, wherein the width of the connecting portion is larger than or equal to half the width of the end of the main body; and forming signal-transmitting wires each having a head portion and a tail wire connected to the head portion, wherein the head portions of the signal-transmitting wires are superimposingly disposed on and electrically connected to the connecting portions of the sensing electrodes. The connecting portions are rectangular or trapezoidal in shape.

More specifically, the width of the connecting portion is equal to half the width of the end of the main body. The connecting portion is positioned at a central position at the end of the main body. Alternatively, the connecting portion is positioned on one side of the end of the main body. The head portion of the signal-transmitting wire completely covers the connecting portion.

More specifically, the width of the connecting portion is equal to the width of the end of the main body. The head portion of the signal-transmitting wire partially covers part of the connecting portion, covering approximately half the area of the connecting portion. The head portion of the signal-transmitting wire is superimposingly disposed on the center of the connecting portion. Alternatively, the head portion of the signal-transmitting wire is superimposingly disposed on a side of the connecting portion. Alternatively, the head portion of the signal-transmitting wire completely covers the connecting portion.

More specifically, the connecting portion has a first edge contacted with the end of the main body and a second edge distant from the end of the main body. The distance between the first edge and the second edge is between 0.02 millimeter and 0.4 millimeter.

More specifically, the method of manufacturing the touch-sensing electrode structure further includes: forming the touch-sensing electrode structure disposed on a substrate.

More specifically, the method of manufacturing the touch-sensing electrode structure further includes: forming a mask layer disposed in the peripheral region and sandwiched between the substrate and the touch-sensing electrode structure.

Application of the present disclosure reduces the chances of burning damages by increasing the width of the connecting portion to reduce the amount static electricity distributed per unit area and heat generated thereat when static electricity is high. Therefore, the present disclosure can provide a touch-sensing electrode structure having good static-electricity endurance.

DETAILED DESCRIPTION OF THE EMBODIMENTS

The aforementioned illustrations and following detailed descriptions are exemplary for the purpose of further explaining the scope of the present disclosure. Other objectives and advantages related to the present disclosure will be illustrated in but not limited by the subsequent descriptions and appended drawings.

Figure 1:
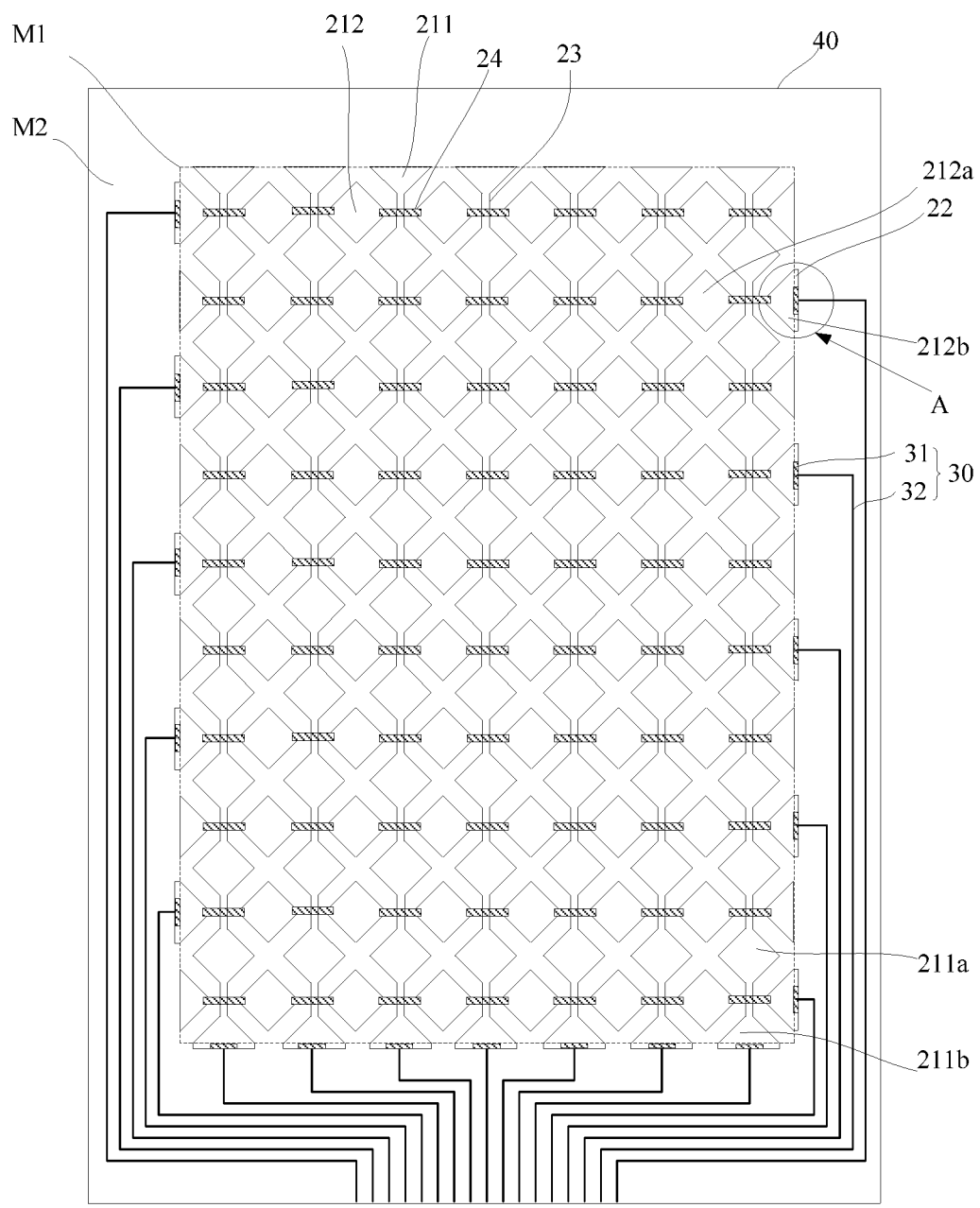
FIG. 1 is a schematic diagram of an embodiment of a touch panel structure according to the present disclosure.
Figure 2:
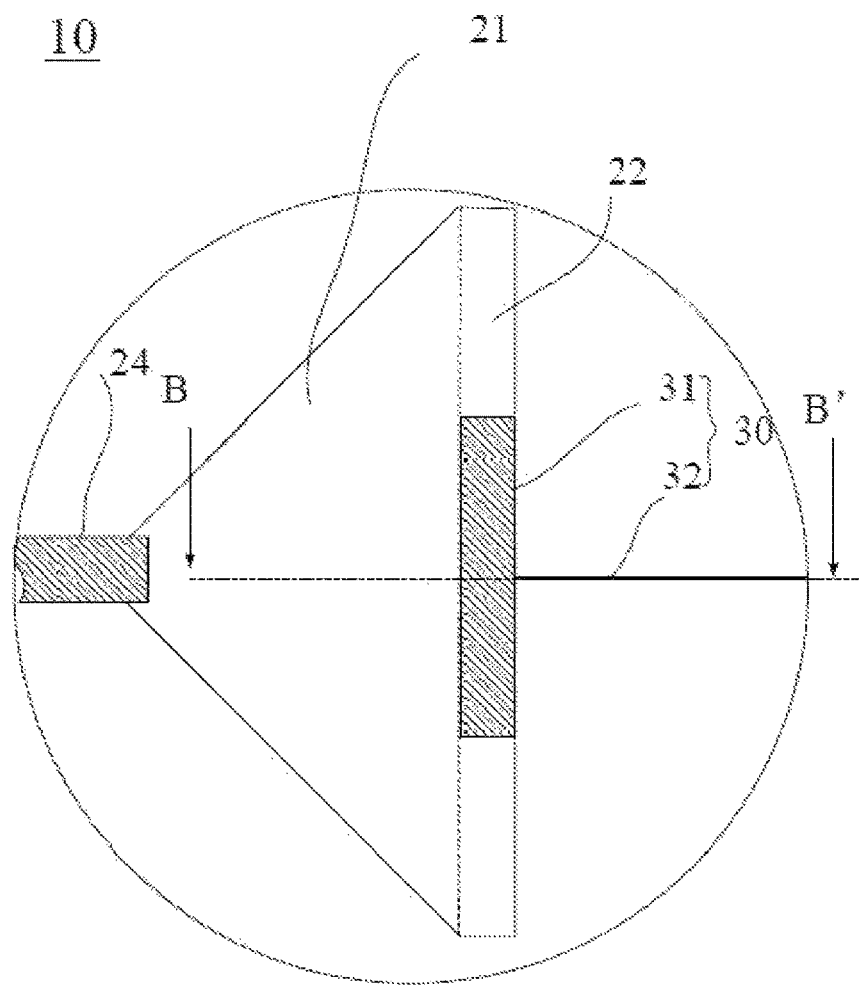
FIG. 2 is an enlarged partial view of region A in FIG. 1.
Figure 3:
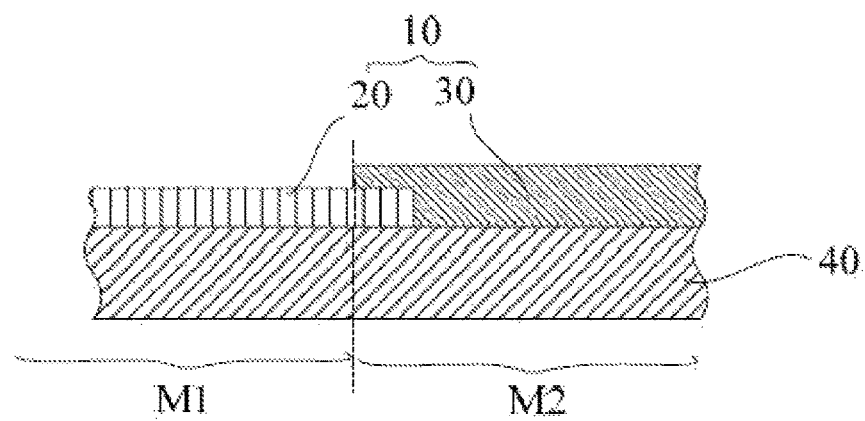
FIG. 3 is a cross-sectional view along section line BB' of FIG. 2.

Drawings reference to FIG. 1, FIG. 2 and FIG. 3. FIG. 1 is a schematic diagram of an embodiment of a touch panel structure according to the present disclosure. FIG. 2 is an enlarged partial view of region A in FIG. 1. FIG. 3 is a cross-sectional view along a sectional line BB' of FIG. 2. The touch panel 100 includes a substrate 40 and a touch-sensing electrode structure 10 disposed on the substrate 40.

The substrate 40 is partitioned into a touch region M1 and a peripheral region M2 surrounding the touch region M1. The substrate 40 can be made of various types of transparent or non-transparent material, flexible or inflexible, such as glass, polycarbonate (PC), polyethylene terephthalate (PET), polymethylmethacrylate (PMMA), polysulfone (PES), or other cyclic olefin copolymers.

The touch-sensing electrode structure 10 includes sensing electrodes 20 and signal-transmitting wires 30. The sensing electrodes 20 include a plurality of first sensing pads 211 distributed along a first direction and a plurality of second sensing pads 212 distributed along a second direction. Two neighboring first sensing pads 211 are connected by a conducting wire 23 there-between. Two neighboring second sensing pads 212 are respectively disposed on two sides of a conducting wire 23 and connected by a conducting bridge 24 spanning over the conducting wire 23. Insulating layers (label omitted) insulate the conducting bridge 24 from the conducting wire 23. It is to be noted that the present disclosure is not limited to the above embodiment. An embodiment can have sensing electrodes 20 formed by a plurality of parallel electrode strips.

As shown in FIG. 1, the first sensing pads 211 can be full-pattern type first sensing pads 211a or 1 partial-pattern type first sensing pads 211b. Similarly, the second sensing pads 212 can be a full-pattern type second sensing pads 212a or a partial-pattern type second sensing pads 212b. The partial-pattern type first sensing pads 211b and the partial-pattern type second sensing pads 212b are allocated near the peripheral region M2. FIG. 2 shows a partial sensing pad, which is a partial-pattern type first sensing pad 211b if distributed along the first direction or a partial second sensing pad 212b if distributed along the second direction. Either case, the partial sensing pad is represented by the main body 21. If the sensing electrode 20 is formed by a plurality of parallel electrode strips, then every strip is a full electrode strip, and no distinction is made between full and partial sensing pads.

Referring to FIG. 2, a connecting portion 22 is connected to an end of the main body 21. The main body 21 is disposed within the touch region M1 of the substrate 40. The connecting portion 22 can be disposed within the peripheral region M2 of the substrate 40, contact with the end of the main body 21, and be electrically connected to the signal-transmitting wire 30. The width of the connecting portion 22 is larger than or equal to half the width of the end of the main body 21. In the present embodiment, the connecting portion 22 is rectangular and occupies the entire width of the end of the main body 21. However in practice, the shape of the connecting portion 22 can be designed according to needs of product application, and can be for example a trapezoid or have other geometrical shapes. The present embodiment does not limit the shape of the connecting portion 22. Additionally, the connecting portion 22 has a first edge contacted with the end of the main body 21 and a second edge distant from the end of the main body 21. The distance between the first edge and the second edge is between 0.02 millimeter and 0.4 millimeter. Actual distance between the edges is determined according to a controller and a touch panel, and is not limited hereto.

In the present embodiment, the material of the sensing electrode 20 can include but is not limited to the various types of transparent electrically conducting material such as indium tin oxide, indium zinc oxide, cadmium tin oxide, aluminum zinc oxide, indium tin zinc oxide, zinc oxide, cadmium oxide, hafnium oxide, indium gallium zinc oxide, indium gallium zinc magnesium oxide, indium gallium magnesium oxide, or indium gallium aluminum oxide.

The signal-transmitting wires are disposed within the peripheral region M2 of the substrate 40 and each includes a head portion 31 and a tail wire 32 connected to the head portion 31. Each of the head portions 31 of the signal-transmitting wires 30 is superimposingly disposed on and electrically connected to the connecting portion 22. The head portion 31 can cover part of the connecting portion 22, e.g. the head portion 31 covers more than half the width of the connecting portion 22. In the present embodiment, the head portion 31 is superimposingly disposed on the center of the connecting portion 22. However, in practice the relative position of the head portion 31 and the connecting portion 22 can be designed according to needs of product application. For example the head portion 31 can be superimposingly disposed on a side (such as an upper side or a lower side shown in FIG. 2) of the connecting portion 22. The present embodiment is not limited hereto. The material of the signal-transmitting wire 30 can be MoAlMo, silver, copper or carbon gel. Preferably, the signal-transmitting wire 30 is made of silver which has good conductivity and low impedance. The signal-transmitting wire 30 can be formed by electroplating or printing, but the present disclosure is not limited hereto.

Figure 4:
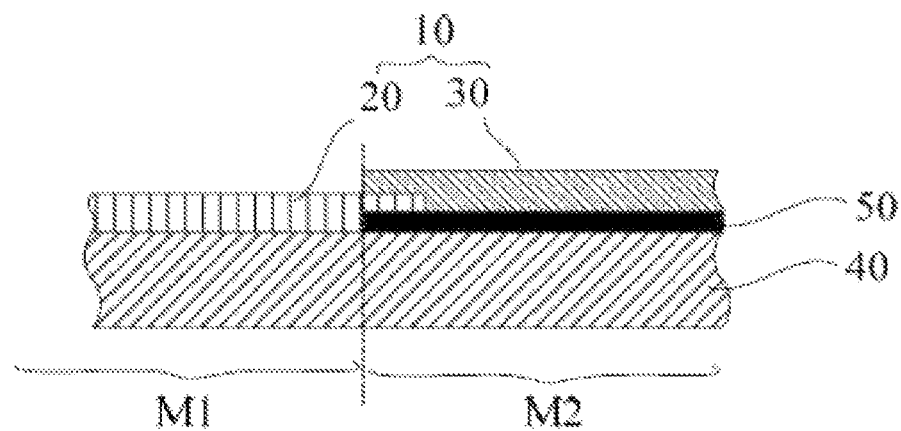
FIG. 4 is a cross-sectional view of another preferable touch panel.

FIG. 4 is a cross-sectional view of another preferable touch panel. When the touch panel is applied on a display panel, the substrate 40 is made of a transparent material. The touch region M1 and the peripheral region M2 can define a display region and a non-display region respectively. With respect to FIG. 3, the substrate 40 of the touch panel is a top cover substrate able to carry the touch-sensing electrode structure 10 and serve as protection. The top cover substrate further includes a mask layer 50 sandwiched between the substrate 40 and the touch-sensing electrode structure 10. In a preferable embodiment, the mask layer 50 is formed on the substrate 40 and positioned at the peripheral region M2 of the substrate 40. In the peripheral region M2, the connecting portions 22 and the signal-transmitting wires 30 are disposed on the mask layer 50. The mask layer 50 is usually made of non-transparent material such as black resin, black photoresist material, or a highly insulating black paint with a low dielectric constant such that electronic components, e.g. signal-transmitting wires 30, can be shielded from the side of the substrate 40 not carrying the touch-sensing electrode structure 10 and not exposed at the user interface, thereby enhancing the aesthetics of the product. If the touch panel 100 is not integrated with the display panel, the substrate 40 can be a non-transparent substrate, and the mask layer 50 can be removed from the touch panel 100. The following details the different embodiments of the touch-sensing electrode structures according to the present disclosure. For lucidity, the following description mainly details the differences between the embodiments without repeating the common parts. Additionally, common components in different embodiments of the present disclosure are similarly labeled to facilitate cross referencing.

Figure 5:
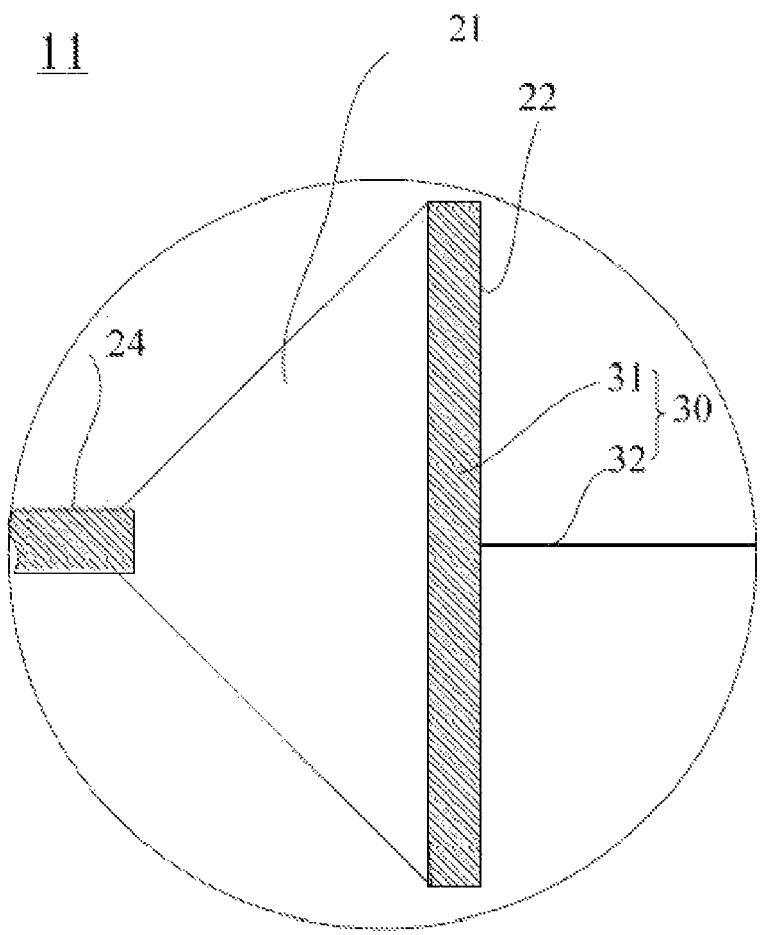
FIG. 5 is a schematic diagram of a touch-sensing electrode structure according to a second embodiment of the present disclosure.

FIG. 5 is a schematic diagram of a touch-sensing electrode structure according to a second embodiment of the present disclosure. The touch-sensing electrode structure 11 differs from the touch-sensing electrode structure 10 of the previous embodiment in that the head portion 31 of the signal-transmitting wire completely covers the connecting portion 22.

Figure 6:
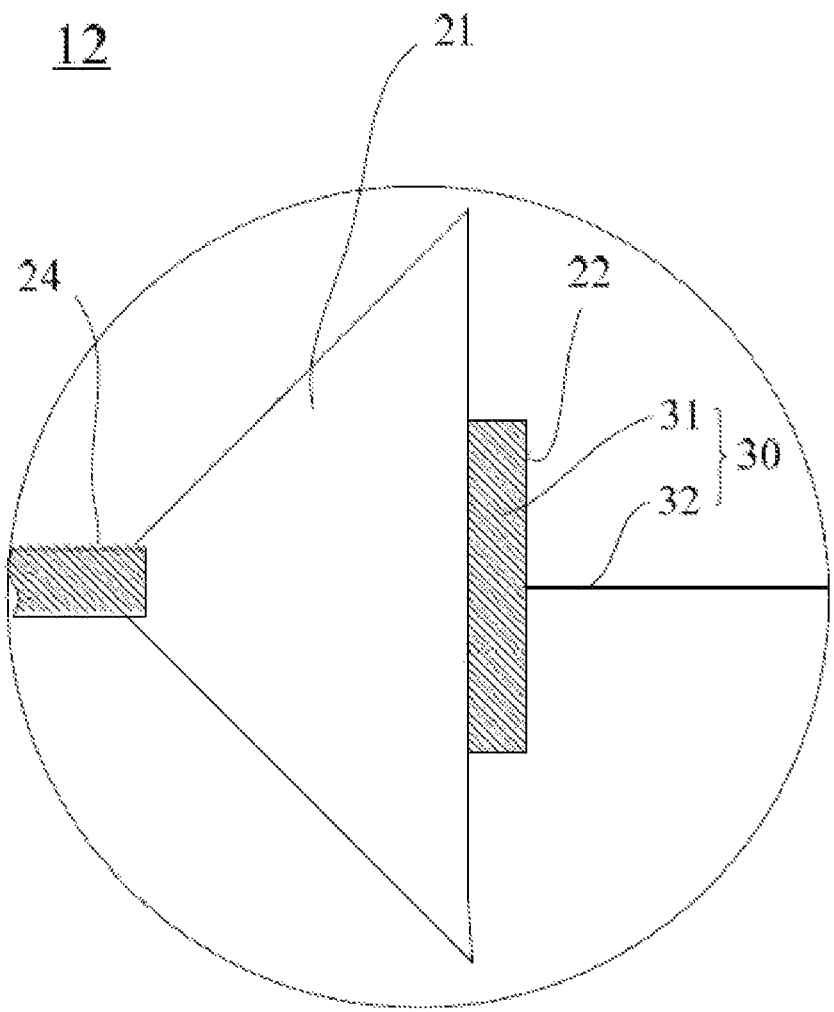
FIG. 6 is a schematic diagram of a touch-sensing electrode structure according to a third embodiment of the present disclosure.

FIG. 6 is a schematic diagram of a touch-sensing electrode structure according to a third embodiment of the present disclosure. The present embodiment provides a touch-sensing electrode structure 12 that the connecting portion 22 is contacted with the end of the main body 21 and is electrically connected to the signal-transmitting wire 30. And the difference between the present embodiment and the touch-sensing electrode structure 10 of the first embodiment is that the width of the connecting portion 22 is half the width of the end of the main body 21 in the present embodiment. In the present embodiment, the connecting portion 22 is positioned at the center of the end of the main body 21. However in practice, the position of the connecting portion 22 can vary according to needs of product application. For example, the connecting portion 22 can be positioned on a side of the end of the main body 21. The present embodiment is not limited hereto.

Figure 7:
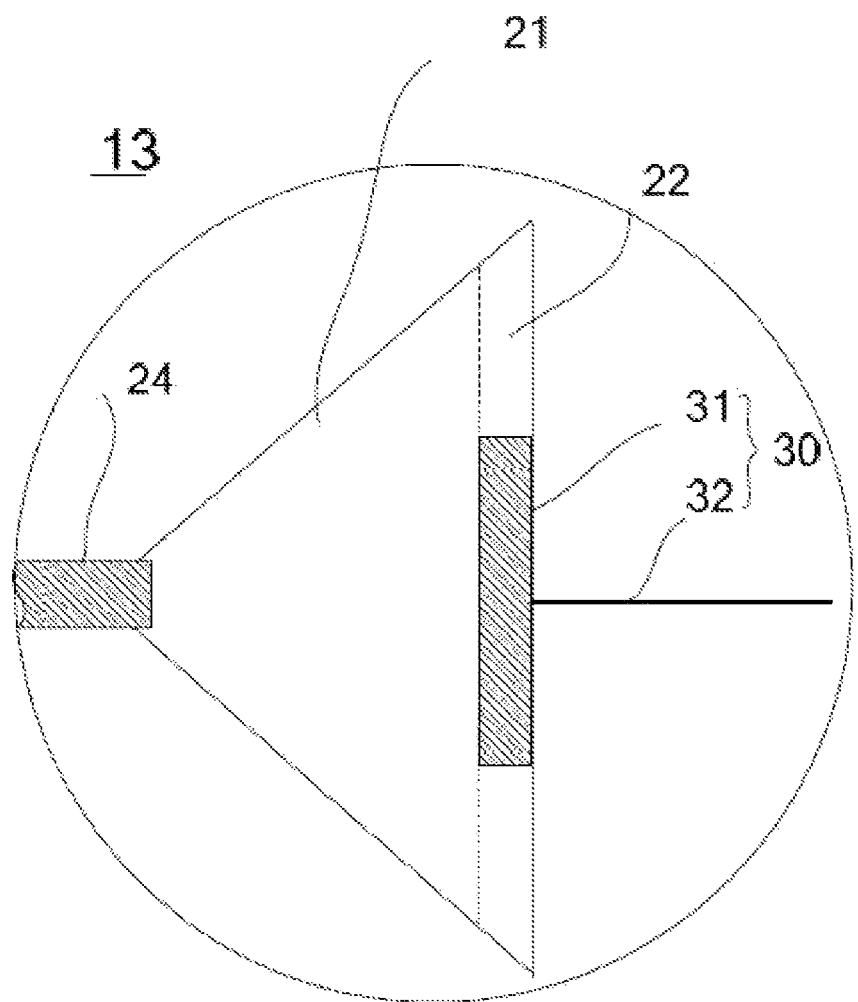
FIG. 7 is a schematic diagram of a touch-sensing electrode structure according to a fourth embodiment of the present disclosure.

According to the shape of the main body 21, the connecting portion 22 can be rectangular or trapezoidal. FIG. 7 is schematic diagram of a touch-sensing electrode structure according to the fourth embodiment of the present disclosure. The touch-sensing electrode structure 13 of the present embodiment differs from the touch-sensing electrode structure 10 of the first embodiment in that the connecting portion 22 is trapezoidal, practically extending from the end of the main body 21. The head portion 31 of the signal-transmitting wire 30 covers more than half the width of the connecting portion 22. In the present embodiment, the head portion 31 is superimposingly disposed on the center of the connecting portion 22. However in practice, the relative positions of the head portion 31 and the connecting portion 22 can be designed according to needs of product application. For example, the head portion 31 can be superimposingly disposed on a side (such as an upper side or a lower side shown in FIG. 7) of the connecting portion 22. The present embodiment is not limited hereto.

Figure 8:
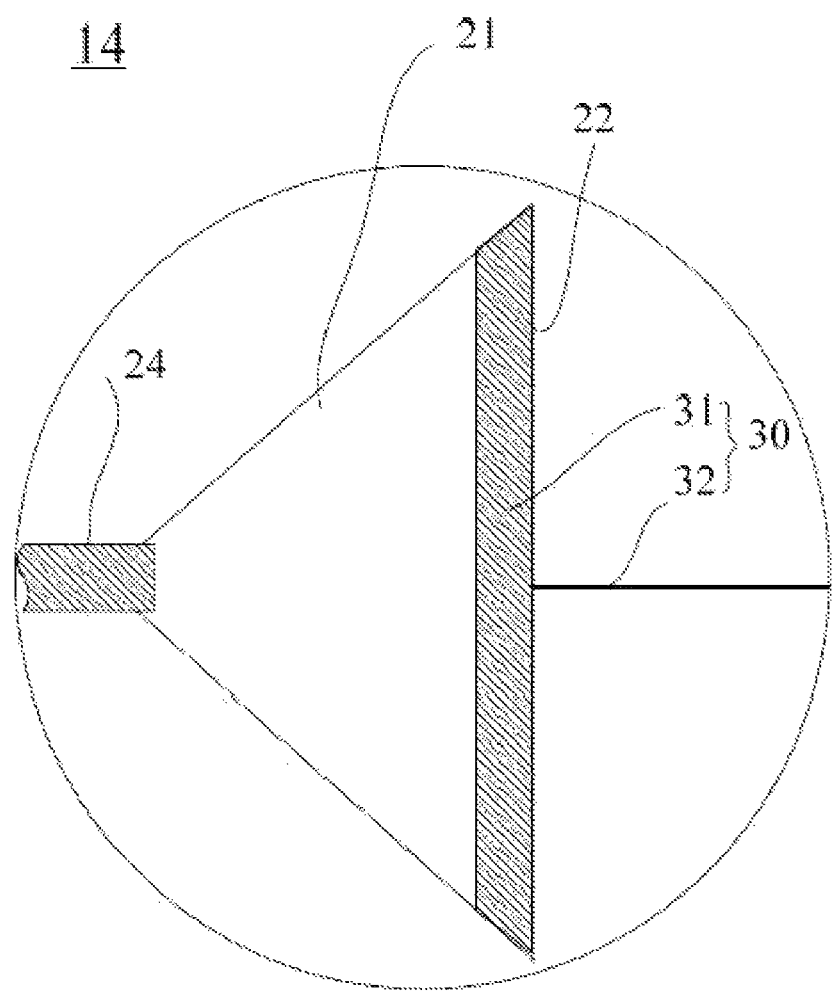
FIG. 8 is a schematic diagram of a touch-sensing electrode structure according to a fifth embodiment of the present disclosure.

FIG. 8 is a schematic diagram of a touch-sensing electrode structure according to the fifth embodiment of the present disclosure. The touch-sensing electrode structure 14 of the present embodiment differs from the touch-sensing electrode structure 11 of the second embodiment in that the connecting portion 22 is trapezoidal, and that the head portion 31 of the signal-transmitting wire completely covers the connecting portion 22.

Figure 9:
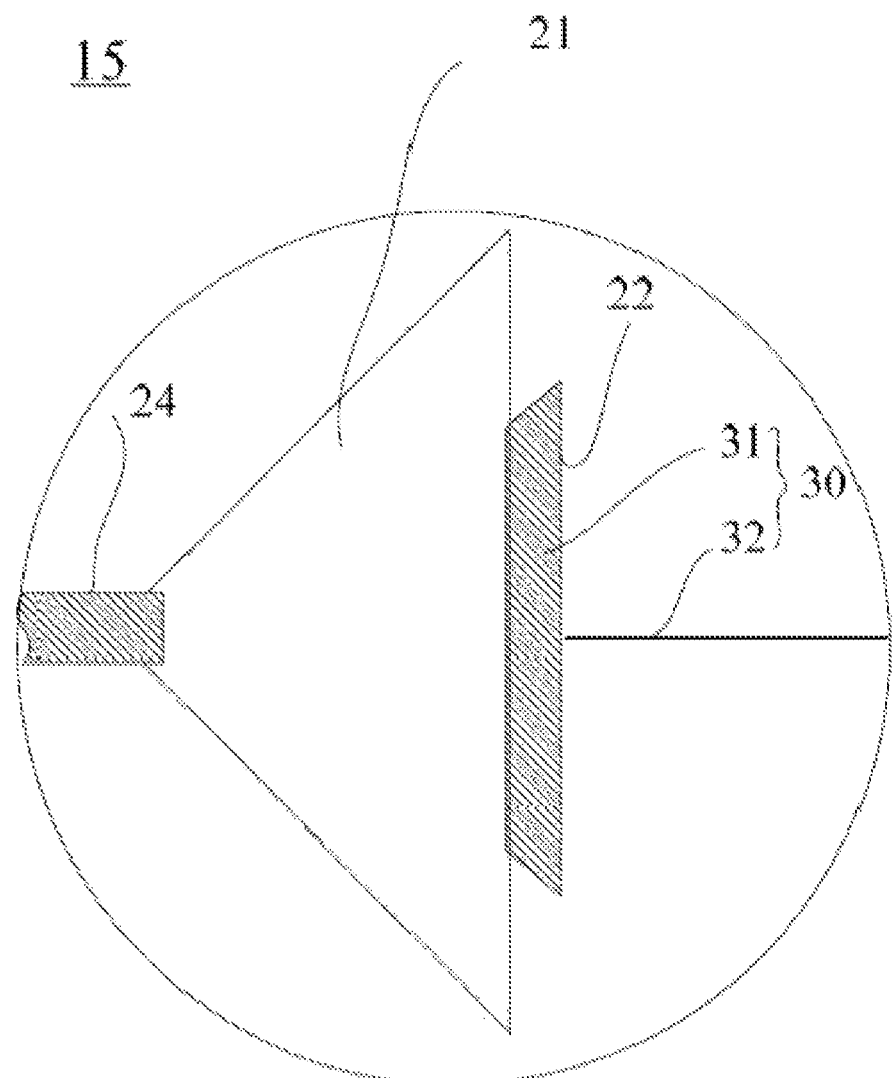
FIG. 9 is a schematic diagram of a touch-sensing electrode structure according to a sixth embodiment of the present disclosure.

FIG. 9 is a schematic diagram of a touch-sensing electrode structure according to a sixth embodiment of the present disclosure. The touch-sensing electrode structure 15 of the present embodiment differs from the touch-sensing electrode structure 12 of the third embodiment in that the connecting portion is trapezoidal and that the head portion 31 of the signal-transmitting wire 30 completely covers the connecting portion 22. In the present embodiment, the connecting portion 22 is positioned at a central position of the end of the main body 21. However in practice, the position of the connecting portion 22 can vary according to needs of product application. For example, the connecting portion 22 can be positioned on a side of the end of the main body 21. The present embodiment is not limited hereto.

The head portions 31 of the signal-transmitting wires 30 of the touch-sensing electrode structure 10, 11, 12, 13, 14, and 15 have width larger than half the width of the end of the main body 21. Therefore, the path for static electricity to flow from the signal-transmitting wire 30 to the connecting portion 22 is increased. Due to this increase in transmission path, the amount of static electricity per unit area on the connecting portion 22 is decreased. According to Joule's Law, the heat generated per unit area on the connecting portion 22 is also reduced, thereby increasing the static-electricity endurance of the touch-sensing electrode structure.

Figure 10:
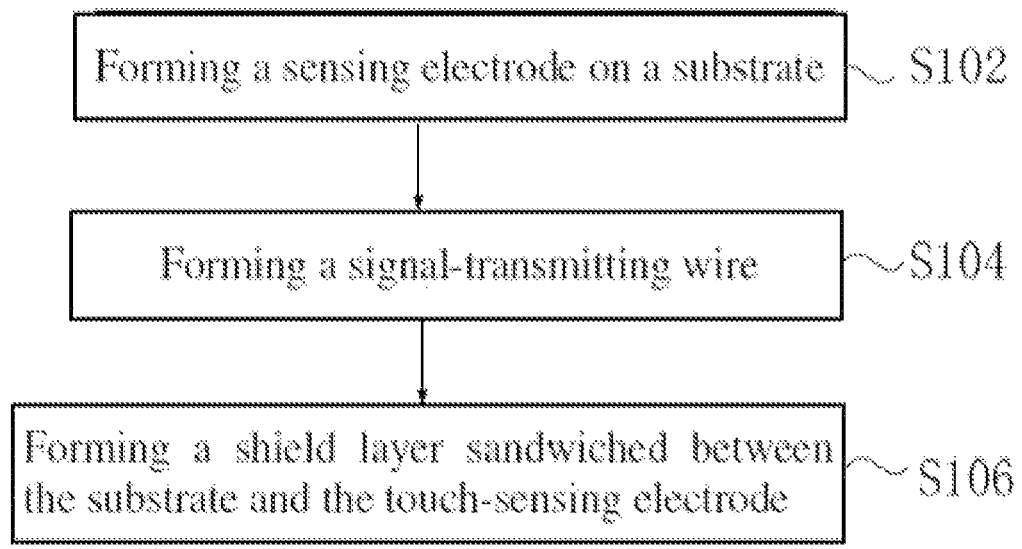
FIG. 10 is a flowchart of a method of manufacturing the touch-sensing electrode structure according to an embodiment.

FIG. 10 shows a method of manufacturing a touch-sensing electrode structure according to an embodiment, including the following steps:

S102: form a sensing electrode. Specifically, form a layer of transparent conducting film on a substrate by spin coating, electroplating, sputtering, printing or other methods. Then apply photolithography on the transparent conducting film to etch out a sensing electrode with the desired pattern. The material of the sensing electrode can be for example indium tin oxide, indium zinc oxide, cadmium tin oxide, aluminum zinc oxide, indium tin zinc oxide, zinc oxide, cadmium oxide, hafnium oxide, indium gallium zinc oxide, indium gallium zinc magnesium oxide, indium gallium magnesium oxide, or indium gallium aluminum oxide. However, the present disclosure is not limited hereto.

The sensing electrode formed includes a plurality of first sensing pads distributed along a first direction and a plurality of second sensing pads distributed along a second direction. Two neighboring first sensing pads are connected by a conducting wire there-between. Two neighboring second sensing pads are respectively disposed on two sides of a conducting wire and connected by a conducting bridge spanning over the conducting wire. It is noted that the present disclosure is not limited to the above embodiment. The first sensing pads or the second sensing pads can be full or partial sensing pads. The first sensing pad distributed along the first direction and the second sensing pads distributed along the second direction are both defined as main bodies. Only the partial-pattern type sensing pads each has an end to connect with a connecting portion. The main body is disposed within the touch region. The connecting portion is disposed in the peripheral region surrounding the touch region. The width of the connecting portion is larger than or equal to half the width of the end of the main body. The connecting portion has a first edge contacted with the end of the main body and a second edge distant from the end of the main body. The distance between the first edge and the second edge is between 0.02 millimeter and 0.4 millimeter. Actual distance between the edges is determined according to a controller and the touch panel.

S104: form a signal-transmitting wire including a head portion and a tail wire connected to the head portion. The head portion of the signal-transmitting wire is superimposingly disposed on and electrically connected to the connecting portion of the sensing electrode. The signal-transmitting wire is printed onto the peripheral region of the substrate. The head portion of the signal-transmitting wire is aligned and printed onto the connecting portion, to realize the superimposing disposal and the electrical connection to the connecting portion of the sensing electrode. The signal-transmitting wire is made of MoAlMo, silver, copper or carbon gel formed by printing or photolithography. The present disclosure is not limited hereto. However, since silver has good conductivity and low impedance, the signal-transmitting wire is preferably made of silver.

Additionally, when the substrate is a top cover substrate having the ability to both carry and protect the touch-sensing electrode layer, further include step S106, which forms a mask layer sandwiched between the substrate and the touch-sensing electrode layer. The mask layer can be formed by printing electroplating or other methods, and be made of black resin, black photoresist material, or a highly insulating black paint with a low dielectric constant. The present disclosure is not limited hereto. For simplification, the present embodiment of the method of manufacturing only lists the main steps without detailing other common routine steps.

It is worth noting that the width and shape of the connecting portion, and the area formed and the position relative to the connecting portion of the signal-transmitting wire are similar to the descriptions of the embodiments in FIG. 5 to FIG. 9 of the present disclosure.

As shown in FIG. 2 or FIG. 7, the width of the connecting portion is equal to the width of the end of the main body, the head portion of the signal-transmitting wire covers part of the connecting portion, and the head portion of the signal-transmitting wire can be superimposingly disposed on the center or a side of the end of the connecting portion. For example:

As shown in FIG. 2 or FIG. 8, the width of the connecting portion is equal to the width of the end of the main body, and the head portion of the signal-transmitting wire completely covers the connecting portion.

As shown in FIG. 6 or FIG. 9, the width of the connecting portion is equal to half the width of the end of the main body, and the head portion of the signal-transmitting wire completely covers the connecting portion. The connecting portion can be positioned at the center or a side of the end of the main body.

Additionally, the connecting portion can be rectangular or trapezoidal. Regarding the material used for the components or the connection between the components, please refer to the description of the aforementioned embodiments.

The present disclosure provides a touch-sensing electrode structure and a method of manufacturing the same. When static electricity is excessive, the increased width of the connecting portion reduces the static electricity distributed per unit area, thereby reducing the amount of heat generated at the connecting portion of the sensing electrode and avoiding damage due to burning. Therefore, the present disclosure can raise the static-electricity endurance of the touch-sensing electrode structure.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. A touch-sensing electrode structure, comprising:
a sensing electrode comprising a plurality of sensing pads and extending in a first direction from a first edge of a peripheral region of the touch-sensing electrode structure to a second edge of the peripheral region, wherein:
the sensing electrode has a main body disposed in a touch region and a connecting portion disposed in the peripheral region, wherein the connecting portion is connected to an end of the main body,
a width of the connecting portion is larger than or equal to half a width of the end of the main body, and
the width of the connecting portion and the width of the end of the main body are measured in a second direction perpendicular to the first direction; and a signal-transmitting wire having a head portion and a tail wire connected to the head portion, wherein:
  the connecting portion has a first section, a second section and a third section, and the second section and the third section are disposed at two sides of the first section,
  the head portion of the signal-transmitting wire is superimposingly disposed on the first section of the connecting portion of the sensing electrode to overlie the first section of the connecting portion of the sensing electrode and is electrically connected to the connecting portion of the sensing electrode, and the second section and the third section are exposed from the head portion of the signal-transmitting wire, and
  a width of the head portion is larger than a width of the tail wire.

2. The touch-sensing electrode structure according to claim 1, wherein the connecting portion is rectangular or trapezoidal shaped.

3. The touch-sensing electrode structure according to claim 1, wherein the width of the connecting portion is equal to half the width of the end of the main body.

4. The touch-sensing electrode structure according to claim 3, wherein the connecting portion is positioned at a central position of the end of the main body.

5. The touch-sensing electrode structure according to claim 3, wherein the connecting portion is positioned at a side of the end of the main body.

6. The touch-sensing electrode structure according to claim 1, wherein:
  the width of the connecting portion is equal to a width of the end of the main body; and
  the width of the end of the main body is measured in the second direction.

7. The touch-sensing electrode structure according to claim 6, wherein the head portion of the signal-transmitting wire covers part of the connecting portion.

8. The touch-sensing electrode structure according to claim 7, wherein the head portion of the signal-transmitting wire is superimposingly disposed on a center of the connecting portion.

9. The touch-sensing electrode structure according to claim 7, wherein the head portion of the signal-transmitting wire is superimposingly disposed on a side of the connecting portion.

10. The touch-sensing electrode structure according to claim 1, wherein:
  the connecting portion has a first edge that contacts the end of the main body and a second edge diametrically opposing the first edge, and
  a distance between the first edge and the second edge is between 0.02 millimeters and 0.4 millimeters.

11. The touch-sensing electrode structure according to claim 1, wherein the touch-sensing electrode structure is disposed on a substrate.

12. The touch-sensing electrode structure according to claim 11, further comprising:
  a mask layer disposed within the peripheral region, wherein a bottom surface of the mask layer is in contact with the substrate and a top surface of the mask layer is in contact with the sensing electrode.

13. A method of manufacturing a touch-sensing electrode structure, comprising:
  forming a sensing electrode comprising a plurality of sensing pads and extending in a first direction from a first edge of a peripheral region of the touch-sensing electrode structure to a second edge of the peripheral region, wherein:
    the sensing electrode has a main body disposed in a touch region and a connecting portion disposed in the peripheral region, wherein the connecting portion is connected to an end of the main body,
    a width of the connecting portion is larger than or equal to half a width of the end of the main body, and
    the width of the connecting portion and the width of the end of the main body are measured in a second direction perpendicular to the first direction; and
  forming a signal-transmitting wire having a head portion and a tail wire connected to the head portion, wherein:
    the connecting portion has a first section, a second section and a third section, and the second section and the third section are disposed at two sides of the first section,
    the head portion of the signal-transmitting wire is superimposingly disposed on the first section of the connecting portion of the sensing electrode to overlie the first section of the connecting portion of the sensing electrode and is electrically connected to the connecting portion of the sensing electrode, and the second section and the third section are exposed from the head portion of the signal-transmitting wire, and
    a width of the head portion is larger than a width of the tail wire.

14. The method of manufacturing a touch-sensing electrode structure according to claim 13, wherein the connecting portion is rectangular or trapezoidal.

15. The method of manufacturing a touch-sensing electrode structure according to claim 13, wherein the width of the connecting portion is equal to half the width of the end of the main body.

16. The method of manufacturing a touch-sensing electrode structure according to claim 15, wherein the connecting portion is positioned at a central position of the end of the main body.

17. The method of manufacturing a touch-sensing electrode structure according to claim 15, wherein the connecting portion is positioned at a side of the end of the main body.

18. The method of manufacturing a touch-sensing electrode structure according to claim 13, wherein the width of the connecting portion is equal to the width of the end of the main body.

19. The method of manufacturing a touch-sensing electrode structure according to claim 18, wherein the head portion of the signal-transmitting wire covers part of the connecting portion.

20. The method of manufacturing a touch-sensing electrode structure according to claim 13, further comprising:
  forming a mask layer disposed within the peripheral region, wherein a bottom surface of the mask layer is in contact with a substrate and a top surface of the mask layer is in contact with the sensing electrode.

21. The touch-sensing electrode structure according to claim 1, wherein:
  the main body is part of a partial sensing pad of the sensing electrode that is adjacent the peripheral region,
  the width of the connecting portion is larger than or equal to half a maximum width of the partial sensing pad, and
  the maximum width of the partial sensing pad is measured in the second direction.

22. The touch-sensing electrode structure according to claim 1, wherein a top surface of the main body and a top surface of the connecting portion are co-planar.

23. The touch-sensing electrode structure according to claim 1, wherein the width of the head portion is less than the width of the connection portion.

24. The touch-sensing electrode structure according to claim 1, wherein the connecting portion is made from a first material and the head portion is made from a second material different than the first material.

25. The touch-sensing electrode structure according to claim 24, wherein the tail wire is made from the second material.

* * * * *